United States Patent [19]
Wicklund et al.

[11] Patent Number: 5,296,748
[45] Date of Patent: Mar. 22, 1994

[54] CLOCK DISTRIBUTION SYSTEM

[75] Inventors: Denton G. Wicklund, Delano; John P. Mullaney, Minneapolis, both of Minn.

[73] Assignee: Network Systems Corporation, Minneapolis, Minn.

[21] Appl. No.: 903,692

[22] Filed: Jun. 24, 1992

[51] Int. Cl.[5] .............................................. H05K 7/20
[52] U.S. Cl. .............................. 307/303.1; 307/482.1; 361/785; 361/796
[58] Field of Search .................. 307/269, 303.1, 482.1; 328/103; 361/785, 788, 796; 439/61, 65

[56] References Cited

U.S. PATENT DOCUMENTS

| | | | |
|---|---|---|---|
| 3,657,701 | 4/1972 | Garth | 340/147 R |
| 3,992,686 | 11/1976 | Canning | 333/84 M |
| 4,679,872 | 7/1987 | Coe | 439/61 |
| 4,685,032 | 8/1987 | Blomstedt et al. | 361/412 |
| 4,777,615 | 10/1988 | Potash | 361/413 |
| 4,812,684 | 3/1989 | Yamagiwa et al. | 307/480 |
| 4,836,107 | 1/1989 | Lang et al. | 361/413 |
| 5,023,754 | 6/1991 | Aug et al. | 361/415 |
| 5,083,238 | 1/1992 | Bousman | 361/413 |
| 5,091,822 | 2/1992 | Takashima | 361/384 |
| 5,122,691 | 6/1992 | Balakrishman | 307/475 |
| 5,140,184 | 8/1992 | Hamamoto et al. | 307/269 |
| 5,239,215 | 8/1993 | Yamaguchi et al. | 307/480 |

OTHER PUBLICATIONS

"To Clear System Bottlenecks Drive Backplanes with ECL" by Jim Mears, Electric Design, Oct. 15, 1987, pp. 83-88.

Primary Examiner—Timothy P. Callahan
Attorney, Agent, or Firm—Haugen and Nikolai

[57] ABSTRACT

A seamless clock distribution scheme for a system incorporating sequential digital logic devices disposed on multiple parallel boards for reducing or substantially eliminating skew. The multiple parallel boards are positioned on and project outward from one side of a centerplane. A single clock board, generating multiple copies of the system clock and mounted at a right angle to the parallel boards on the opposite side of the centerplane are connected by shared pins passing through apertures formed in the centerplane. This shared pin connection allows for simple, though near-ideal transmission of the clock signal copies between the parallel logic boards and the clock board with a minimum mismatch of the clock signal between two parallel boards.

11 Claims, 3 Drawing Sheets

CENTER PLANE

CLOCK DISTRIBUTION SYSTEM

BACKGROUND OF THE INVENTION

I. Field of the Invention

This invention relates generally to digital computing and switching systems, and more particularly to a method and apparatus for distributing clock pulses to multiple clocked digital devices with little or no skew resulting.

II. Discussion of the Prior Art

A stable oscillator is an essential element of any digital system employing sequential logic. Digital computers, both general purpose and special purpose, are examples of sequential logic systems. Special purpose digital devices such as switches, multiplexors and device controllers may also employ sequential logic. A typical sequential logic digital system contains a single oscillator, known as the master clock, which controls the sequential operation of all of the digital logic which comprises a given system. The clock distribution system is the means by which the master clock signal is transformed, replicated and distributed to each clocking site in the system.

The leading edge of each clock cycle typically captures the results of the logical operations performed in the previous cycle such that these results become the source of input data for the logical operations to be performed in the present cycle. Proper operation requires that logical results propagate to every clocking site before the corresponding clock signal arrives. From the foregoing it can be understood that the ultimate throughput, i.e., the number of logical steps per second, of any sequential logic system is constrained by both the propagation delay of the combinatorial logic circuits and the uncertainty regarding the time of arrival of the clocking signal at the many clocking site distributed throughout the system. The difference between earliest and latest possible time of arrival of all clock signals is defined as clock skew. It is a common practice to minimize clock skew to thus allow the largest possible fraction of each clock cycle to be available for useful computational work.

A clock distribution system is typically comprised of a master oscillator, wave shaping circuits which establish specified on and off periods for the clock signal, fan-out circuitry which regenerates and replicates the clock signal, and transmission circuitry which distributes the fanned-out signals to remote clocking sites. Most systems require a multi-phase clock which is a set of clock signals having identical wave shape and a specified phase relationship. This discussion will deal only with the distribution of a single phase clock, recognizing that additional phases or subordinate clock signals may be derived after distribution. Also, all comments made regarding the distribution of a single-phase clock are equally applicable to the distribution of a multi-phase clock employing a separate distribution system for each phase.

A clock distribution system is analogous to a wheel comprised of a hub, spokes and rim. The master oscillator and wave shaping circuits are located at the hub. Each spoke represents a divergent transmission path to the remote clocking sites located at the rim. Clock skew arises from the difference in propagation time from spoke to spoke and in an ideal system each spoke would have identical propagation time and negligible degradation of the clock wave shape.

The principal contribution to clock skew is the difference in the electrical length of the transmission circuitry. The electrical length is a function of both the physical length of the electrical conductor and the dielectric medium surrounding the conductor. Electrical signals propagate approximately one foot in one nanosecond in free space, however the propagation time increases as the dielectric constant of the surrounding medium increases. Further an impedance mismatch between the driver circuit and the transmission circuitry may additionally increase propagation time due to signal reflections. In a typical system, the transmission circuitry will include printed circuit foil on the cards which contain the source and destination of the active circuitry, the conductors which comprise the interconnecting backplane and intervening connectors. Since the destination circuitry can be located anywhere in the system, it is inevitable that there will be a disparity in the physical length of the many transmission paths of a typical system. There will be an even greater disparity in the electrical length of transmission paths due to the dielectric differences between the path segments associated with printed circuit boards, connectors and backplane, even when the backplane is itself a multi-layer printed circuit board. The electrical length is further affected by the proximity of the transmission conductors to ground planes and the loading effect of stubs along the transmission path.

Various approaches have been devised for propagating a system clock to digital logic devices populating multiple printed circuit boards. A typical minicomputer shown in FIG. 1, comprises a number of parallel boards, including a CPU card 105, an I/O card 108, and two memory cards 106 and 107. The cards 105 through 108 are interconnected by a backplane 104, with each card connecting to the backplane through a connector 110 having a plurality of terminal pins. The backplane carries data and control signals between the different boards. To make sure that all boards work at the same beat, a special signal called "System Clock" is used to time all of the circuitry on all of the boards. In the example of FIG. 1, the System Clock generator 120, located on the processor board 105, sends the system heartbeat to the circuits 121 of board 105 through the conductive printed circuit traces 113 contained on the board 105, then to the circuits 122 of board 106 through connector 109 of board 105, trace 114 of backplane 104, connector 110 of board 106 and trace 115 of board 106. The generator also sends the heart beat to circuits 123 of board 107 through connector 109 of board 105, trace 114 of the backplane 104, connector 111 of board 107, trace 116 of board 107 and to circuits 124 of board 108 through connector 109 of board 105, trace 114 of backplane 104, connector 112 of board 108, and trace 117 of board 108.

There are two main problems with the prior art clock distribution in the minicomputer configuration illustrated in FIG. 1, namely, clock skew and clock waveform distortion. Concerning clock skew, all clock signals applied to the clock inputs of ICs 121 through 124 must be synchronous or, at least synchronous within an acceptable range. The difference in timing between the clock signals on ICs 121 and 124 is called "clock skew", and a typical value of this clock skew across a system such as is illustrated in FIG. 1 is about 10 percent of the system clock. This corresponds to about four nanoseconds for a system clock running at 25 MHz, corresponding to a 40 ns cycle time. Clock skew, of course, depends upon the difference in clock signal propagation time for the different clock signal paths. This propagation time itself depends on the electrical length of the path and the loading of the clock generator. The path electrical length depends on its physical length and on the different electrical characteristics of the path. In the arrangement shown in FIG. 1, there is a very short physical length of the path from the clock generator 120 to the clock input of IC 121, especially when contrasted to the path length from the clock generator 120 to the IC 124 on the I/O 108. Here, the clock signal must traverse the foil on board 105 leading to the connector 109, through the connector 109 and through the bus 114 on the backplane 104, through the connector 112 for I/O card 108 and, thence, through the printed wiring on that card to the clock input of IC device 124. Assuming a backplane, which is 16 inches in length and that the IC traces on the cards 105 and 108 are each five inches, the path from the clock generator 120 to the device 124 represents an additional physical length of about 26 inches or 2 ns for a typical epoxy backplane. In addition cross the connectors 109 and 112 such that the minimum skew between the two paths is 3 ns.

A significant improvement in reducing clock skew can be achieved using the prior art arrangement shown in FIG. 2 disclosed in an article by Mears entitled "To Clear System Bottlenecks Drive Backplanes with ECL", *Electronic Design Bow* 35, No. 24, Oct. 15, 1987, pp. 83-88. It shows how the overall distance between the parallel boards can be reduced by placing a clock board 120 on the opposite side of the backplane, now called the centerplane, in that both sides thereof are utilized. The traveling distance of the clock signal via trace 114 is minimized as represented in FIG. 2, but this scheme requires a complex assembly procedure of the connectors that are now soldered on both sides of the backplane.

Another prior art attempt to minimize the skew problem in distributing clock signals from a clock pulse generator to ICs on a series of logic boards is set out in an article entitled "High Chip Density Boosts Performance of Interactive Parallel Super Computer" by John Bond, *Computer Design* Vol. 29, No. 17, Sep. 1, 1989, pp. 48-50. The scheme disclosed in that article uses an active backplane as is represented in FIG. 3. In this arrangement, active circuitry, such as the clock generator 120, is soldered onto the backplane rather than being disposed on a separate board plugged into the backplane. This offers the advantages of eliminating the need for additional clock distribution board and optimization of the distance between boards. Distances are even shorter if the clock circuitry 120 is mounted on the second side of the backplane, whose first side is occupied by the connectors of the parallel boards.

The drawback to the arrangement shown in FIG. 3 is the attendant complexity in the design of the backplane which now has components on it. This makes it more expensive to manufacture because there must be more traces in the backplane to accommodate the added components. The arrangement shown in FIG. 3 has the additional problem in that the backplane is used as a controlled medium for transmission of clock signals. In practice, the backplane is heavily used for routing a large number of data and control signals and it is very difficult to guarantee that the clock signal will be given precedence over these data and control signals to minimize the miss-match. For example, in a typical minicomputer, such as the one represented in FIG. 1 the backplane 104 would commonly connect ten cards together through connectors having, for example, 400 connects each. This means there are 4,000 connector points or pins. Each pin has to be connected at least to one other pin in the backplane by means of a trace. Thus, in the example under discussion, about 4,000 traces would be required. Because the dimensions of the traces are defined by the backplane technology and cannot be reduced at will, the number of layers of the backplane needs to be increased if it is to support active components thereon. Some backplanes now have up to 60 layers, and their cost is extremely great. If the best possible matching paths for the clock signals through the backplane are to be achieved, a dedicated layer sandwiched between a ground plane and a power plane, must be used if impedance considerations are to be addressed. Increasing the complexity of the backplane by these three layers compounds the cost problem.

Another way of solving the clock distribution problem to minimize skew is to provide an independent clock propagation path outside of the backplane. This can be achieved using discrete cables or discrete optical fibers of equal electrical length running from the clock generating board to the parallel logic boards. The use of cables, however, is not always possible when system size constraints are considered. If the digital system must meet stringent volume requirements, the added bulk attributable to multiple cables used for distributing clock signals from the clock generator to the individual circuit cards can make this an unacceptable solution.

OBJECTS

It is a prime object of the invention to provide an improved method of clock distribution which permits clock signals to be transmitted to a multiplicity of printed circuit boards comprising a sequential digital logic system with substantially no clock skew and without resorting to known skew compensation techniques.

It is yet another object of the invention to incorporate a substantial portion of the clock distribution circuitry, particularly that portion of the clock distribution circuitry which would otherwise contribute significantly to clock skew, into a single printed circuit assembly which can be economically manufactured and tested.

It is yet another object of the invention to make all clock distribution circuitry electrically independent of the interconnecting backplane thereby simplifying the backplane circuitry and eliminating the deleterious effect that clock distribution signals may have on other backplane signals due to crosstalk.

SUMMARY OF THE INVENTION

The present invention provides a system for distributing clock signals to a plurality of clocked digital logic devices located on a plurality of logic circuit boards. The system comprises a centerplane member having first and second major surfaces and a plurality of apertures extending through the thickness dimension of the centerplane. A plurality of logic circuit boards, each populated with the clocked digital logic devices that are interconnected with conductive foils, are arranged with one side edge thereof disposed adjacent to the first major surface of the centerplane member and they project outwardly therefrom in parallel spaced relationship with respect to one another. The side edges of the logic circuit boards adjacent the centerplane include multicontact connector members. The system further includes a clock distribution board having one side edge thereof disposed adjacent to the second major surface of the centerplane member and it is oriented orthogonally to both the centerplane member and to the plurality of logic circuit boards across the centerplane. The clock distribution board also has a multi-contact connector member mounted on the one edge thereof that is adjacent the centerplane. Populating the clock distribution board is an oscillator for producing regularly occurring clock pulses, one or more drivers coupled to the oscillator for producing multiple copies of the clock pulses and conductive foils for distributing the multiple copies to individual contacts of the multi-contact connector member. The conductive foils are of equal physical length and because they are mounted on a common substrate, they then provide substantially equal electrical length as well. Hence, clock pulses produced by the oscillator arrive in exact time coincidence to the individual contacts on the edge connector.

Completing the assembly are a plurality of shared, conductive pin members which extend through at least some of the apertures in the centerplane at the points where the side edges of the logic circuit boards and the clock distribution member are juxtaposed. Each of the pins includes a first end for connecting to the edge connector of one of the plurality of logic circuit boards and a second end for connecting to the edge connector of the clock distribution board. Hence, the multiple copies of the clock pulses are applied through the centerplane member to the plurality of logic circuit boards in exact time coincidence and without skew.

DESCRIPTION OF THE DRAWINGS

The foregoing features, objects and advantages of the invention will become apparent to those skilled in the art from the following detailed description of a preferred embodiment, especially when considered in conjunction with the accompanying drawings in which like numerals in the several views refer to corresponding parts.

DESCRIPTION OF THE PREFERRED EMBODIMENT

Figure 1:
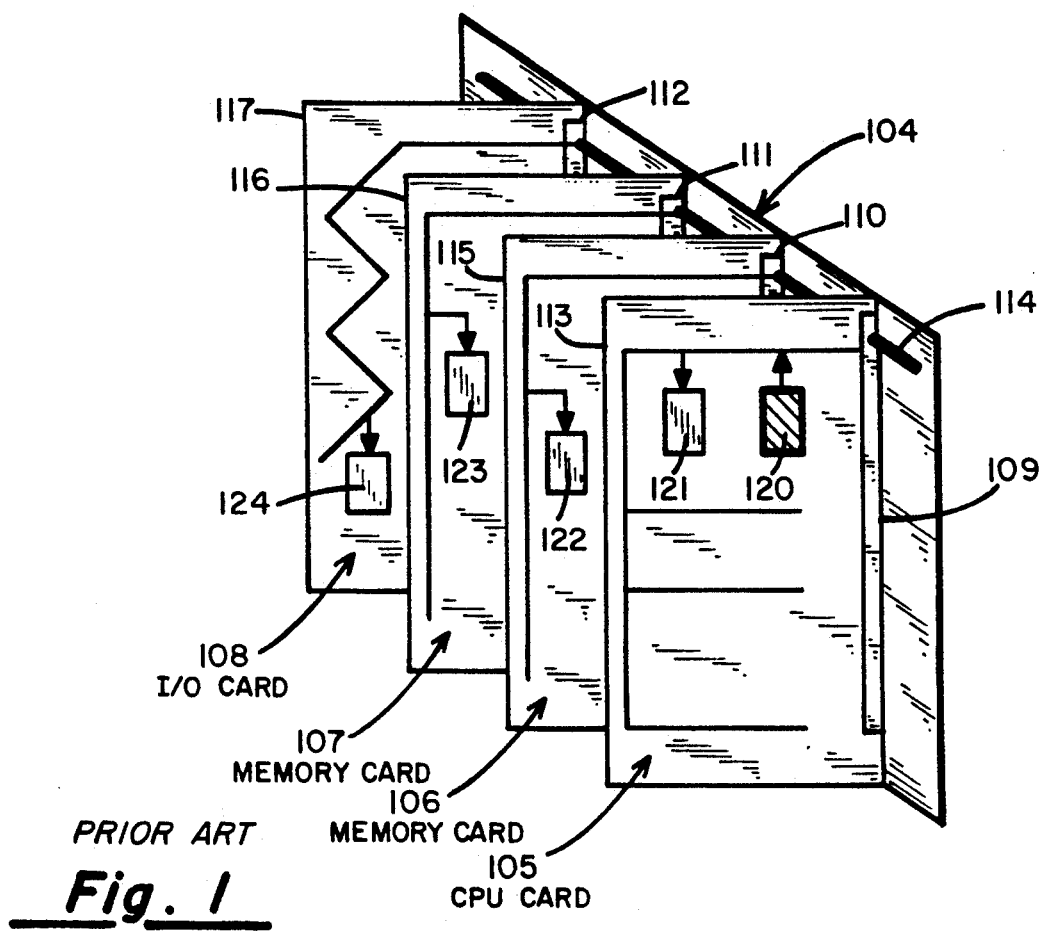
FIG. 1 illustrates the card layout of a typical prior art minicomputer.
Figure 2:
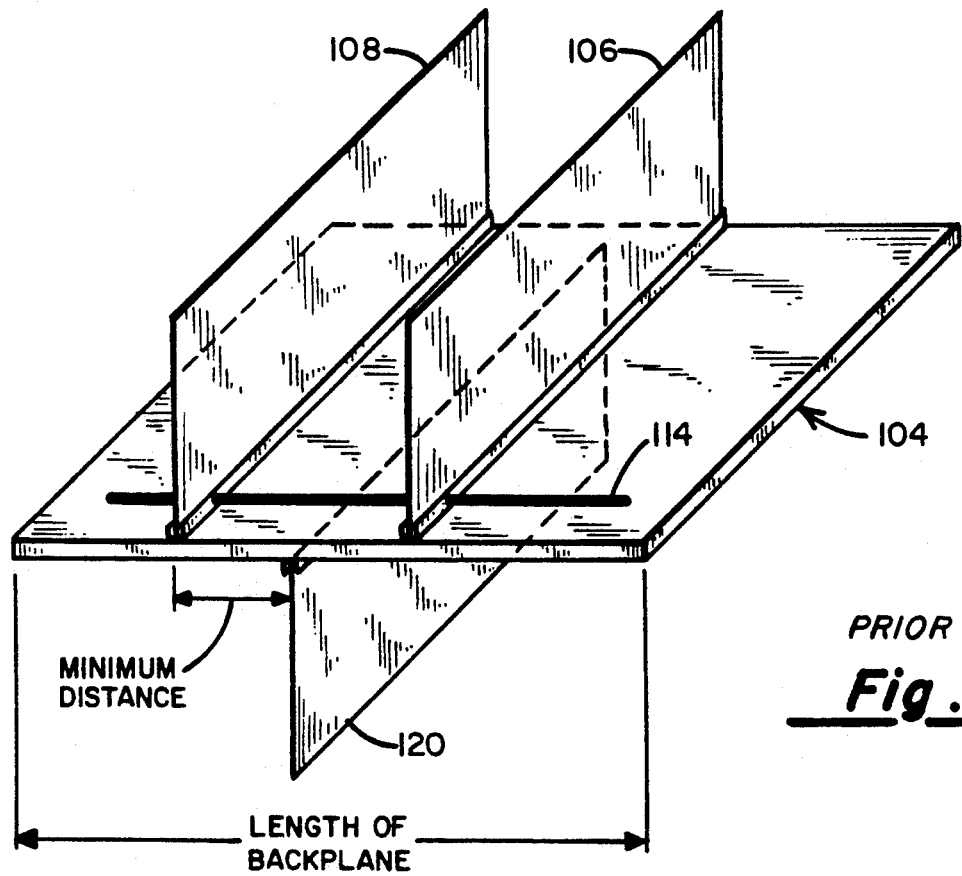
FIG. 2 illustrates a further prior art clock distribution technique.
Figure 3:
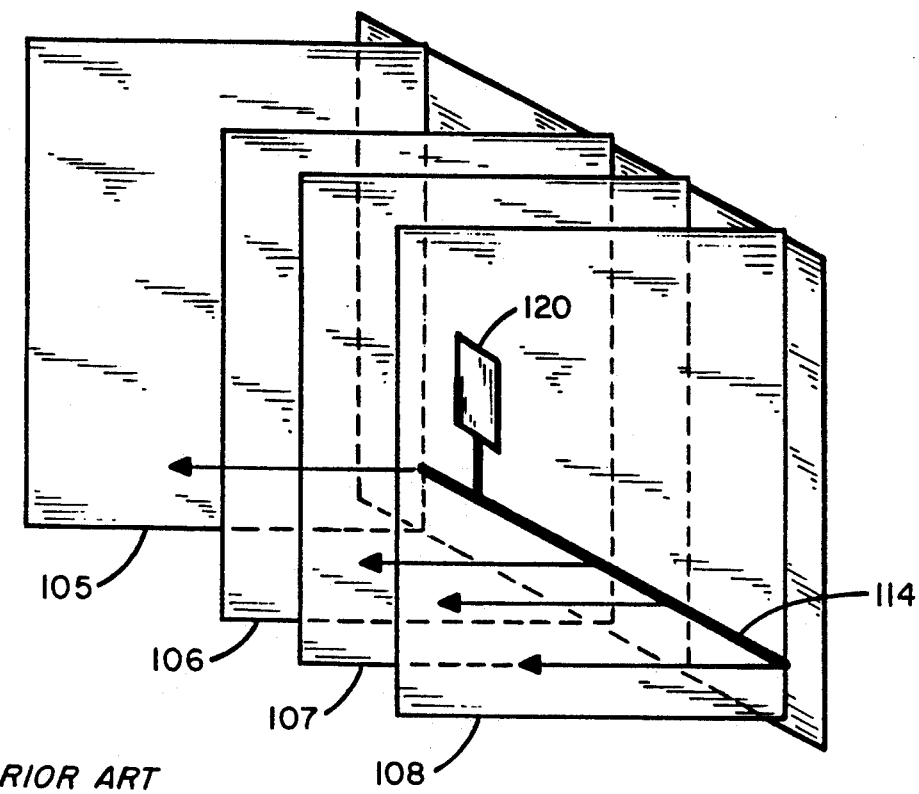
FIG. 3 depicts yet another prior art approach to clock distribution using an active backplane.
Figure 5:
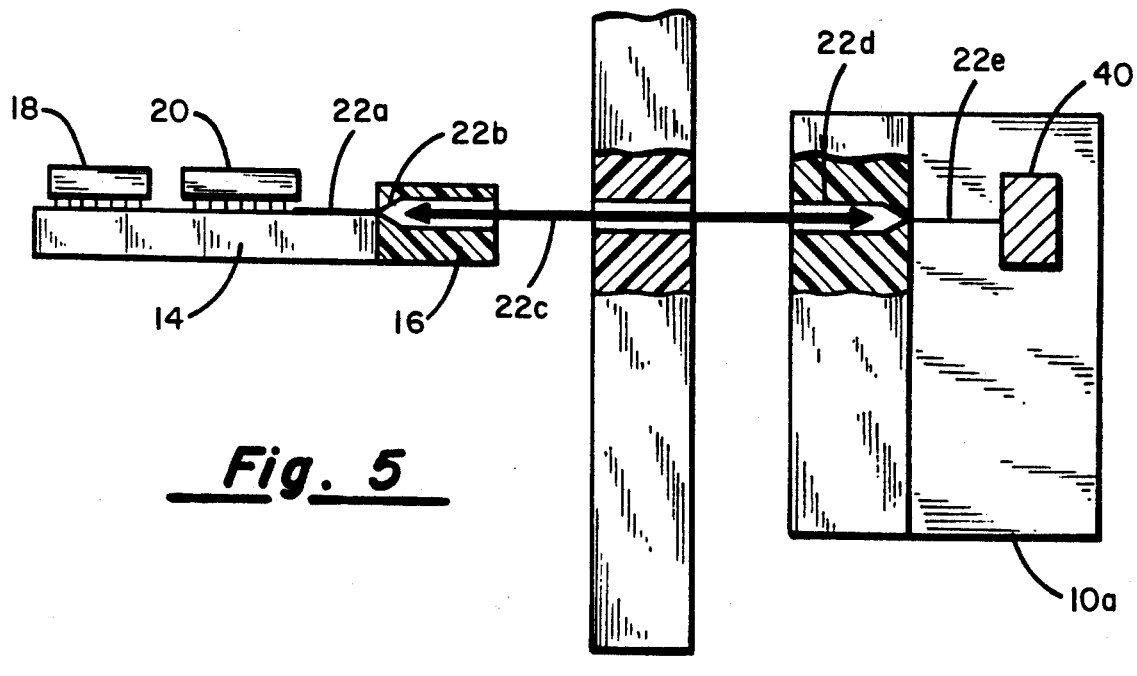
FIG. 5 is a schematic diagram of a portion of the apparatus of FIG. 4.
Figure 4:
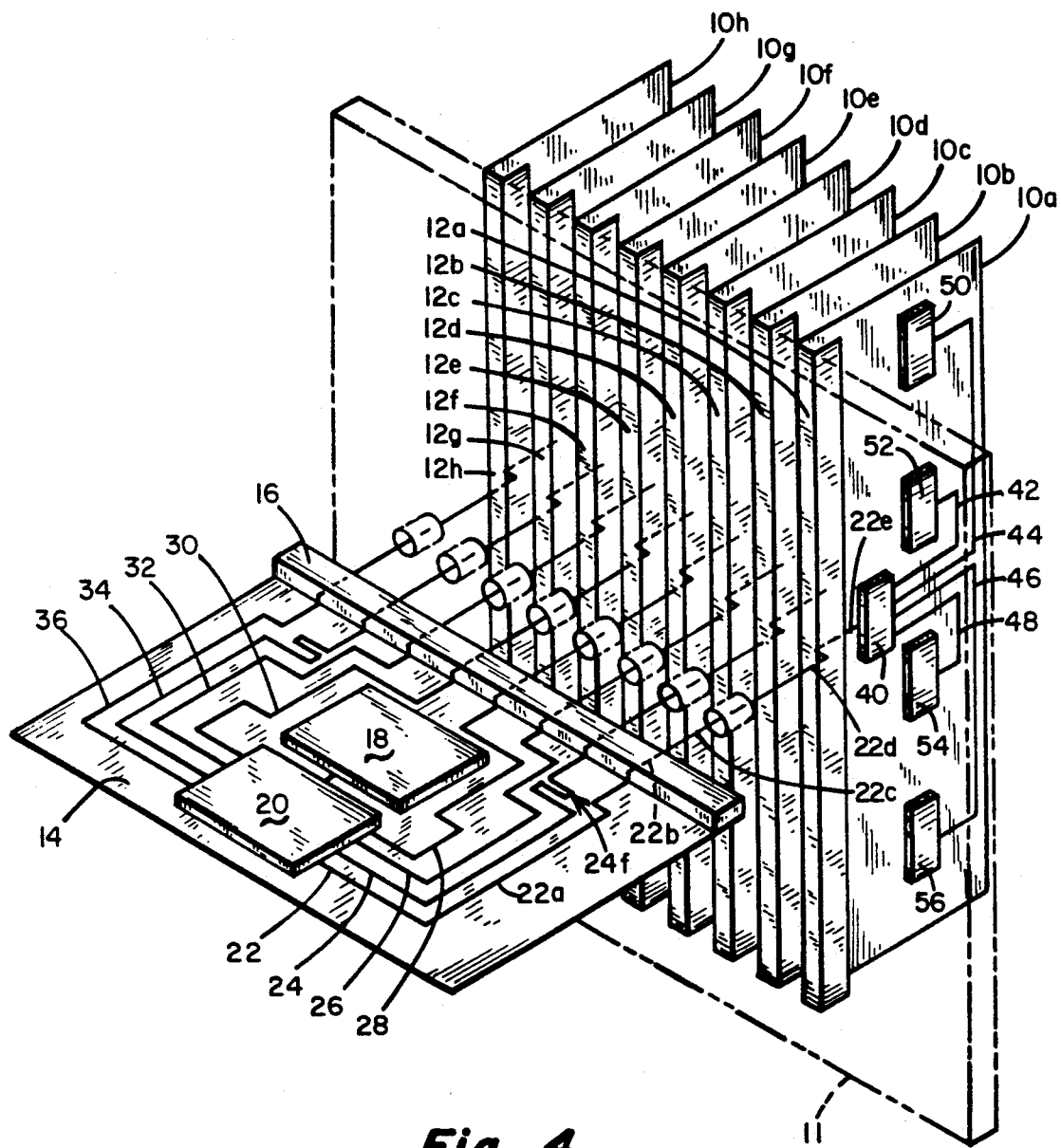
FIG. 4 is a perspective drawing of the clock distribution apparatus of the present invention but with the centerplane shown in phantom for providing clarity.

FIG. 4 shows a diagrammatic isometric representation of the preferred embodiment of the clock distribution system as it might be employed in a typical digital system such as a minicomputer. The digital circuits which comprise the system are packaged in a conventional manner on a set of printed boards 10a through 10h. Each printed circuit board has a multi-pin edge connector as at 12a through 12h, which allows the printed circuit boards to be electrically interconnected via centerplane wiring. The centerplane 11 is shown in phantom line and the conventional card cage structure for supporting the cards and the digital circuitry, exclusive of the clock distribution circuitry, have been omitted in FIG. 4 to more clearly illustrate the instant invention. The schematic diagram of FIG. 5, however, illustrates the centerplane and the shared pins used to effect interconnections.

With no limitation intended, connectors 12a–12h may be modular receptacle assemblies of the 53919 series manufactured by Amp Incorporated. The centerplane assembly is preferably of the multi-layer printed circuit type employing pin header modules of the 535843 series, also manufactured by Amp Incorporated, as a mating male type connector for the corresponding female connectors 12a–12h however, selectively modified to accommodate the clock distribution circuitry.

The interconnection of printed circuit boards 10a–10h, exclusive of clock distribution, is accomplished in the conventional manner, i.e., each pin header contact is electrically connected to printed circuit foil contained in the centerplane and, thus, does not necessarily extend out of the backplane. However, the pin header contacts associated with the clock distribution circuitry must be extended to permit electrical connection from both sides of the centerplane. There may be other purposes for which such pin header extension is advantageous, such as described in copending application Ser. No. 07/745,518, filed Aug. 15, 1991, assigned to applicant's assignee.

A novel feature of the invention is orientation of clock distribution board 14 which is disposed orthogonally to circuit boards 10a–10h and is located on the opposite side of the centerplane This arrangement allows more ideal clock distribution without sacrificing the economy and low cost of well proven printed circuit fabrication methods. The clock circuit board is comprised of a master oscillator 18 for producing regularly occurring System Clock pulse signals, a clock driver 20, clock signal conductors 22 through 36 and a connector 16. The master oscillator is preferably a quartz crystal oscillator have a frequency which is twice the desired clock frequency. Clock driver circuit 20 may be a type SC3501 PECL manufactured by Silicon Connections Corporation. This circuit chip contains 20 positive 5-volt ECL (Emitter Coupled Logic) driver circuits, each connected to a separate output pin and is thus capable of generating up to 20 copies of an ECL clock signal, having substantially identical waveshape and phase as the original. ECL circuity is preferred, even for systems which are implemented in other forms of logic, such as TTL (Transistor Transistor Logic) or CMOS (Complimentary Metal Oxide Semiconductor) logic because the advantage of lower clock skew using ECL outweighs the disadvantage of converting the signal after distribution.

One copy of the clock signal is provided to each of the clock signal conductors 22 through 36. For clarity, the clock signal conductors have been illustrated using heavier lines in FIG. 4. Edge connector 16 is preferably of the same type as connectors 12a–12h.

The remainder of the clock distribution system is contained on each of printed circuit boards 10a–10h. This circuitry typically includes a high-speed, multiple-output ECL buffer circuit 40, clock signal conductors 42 through 48, and optional logic level converters 50 through 56. A type 100125 ECL-to-TTL converter, manufactured by Fairchild Corporation, may be used if the digital system is implemented with TTL logic. It regenerates the clock signal thereby mitigating any waveshape deterioration introduced by connectors 16 and 12. It also provides an additional level of fan-out of the clock signal.

The advantages of the instant invention can be best understood by tracing one of the "spokes" of the clock distribution system. Clock signal conductor 22 has been divided into segments labeled "a" through "e" to aid in this tracing. Segment 22a is a controlled impedance printed circuit transmission line which provides the signal path from the output of the clock driver circuit 20 to connector 16. Segment 22b is the female connector socket associated with multi-pin connector 16. Segment 22c represents the aforementioned male type pin header which passes through the centerplane (11) but is electrically isolated from all centerplane circuitry. Segment 22d is the female connector socket associated with multi-pin connector 12a. Segment 22e provides the signal path from connector 12a to ECL buffer 40.

Clock signal conductors 42 through 48 provide a controlled impedance signal path from buffer 40 to logic level converters 50 through 56. All clocking sites in the system are connected to the nearest logic level converter. It is intended that logic level converters be dispersed throughout the board such that the skew contribution of the clock signal traveling from the output of any logic level converter to any clocking site can be as small as practical without creating an undue overhead for clocking. The number and placement of these converters, or the use of alternative fan-out circuitry, will be dictated by the throughput performance desired of the digital system in which the clock distribution system resides.

Although not shown in FIG. 4, it is contemplated that circuit boards 10b through 10h would also have clock distribution circuitry corresponding to that shown for board 10a, with the number and placement of clock converter circuits conforming to the unique clocking requirements of each board. It is preferable, however that the location of buffer circuit 40 remain constant from board to board.

Clock distribution board 14 is designed such that the segments of clock signal conductors 24 through 36, which corresponds to segment "a" a clock signal conductor 22, have substantially the same physical length. This is achieved by using a serpentine pattern in certain locations such as at 24f and 34f, as required to equalize length. Since these segments are controlled impedance transmission lines and are located on a common printed circuit board where the characteristic impedance and dielectric constant can be readily controlled to be uniform across the boar, equal physical length also means that the electrical length of all a segments will be substantially equal. Thus, a near ideal distribution of clock signals is accomplished at the interface of connector 16, i.e., all clock signals are substantially in phase without any determinant skew. All that remains is the small amount of indeterminant skew which may be associated with the manufacturing tolerances of clock driver circuit 20 and the printed circuit of clock distribution board 14. The near ideal distribution of the clock signals extends to segment 22e and the input of the corresponding ECL buffer, by virtue of the symmetry of segments 22b through 22e to the corresponding segments of clock signal conductors 24 through 36.

In prior art clock distribution systems, propagation of clock signals through connector pins is a source of clock skew, since the manner in which the connector impedance discontinuity perturbs the clock signal is a function of the position of the connector along the transmission line. The instant invention assures that there is only one discontinuity, that it is located in the same electrical position on each clock transmission line and that it is located in the most advantageous position. With the connector discontinuity placed near the ECL buffers, the perturbation of the signal is both small and uniform. Since the response of the ECL buffers to the uniformly perturbed signals also tends to be very uniform, the clock skew contribution normally associated with connector discontinuities is suppressed. This means that the clock signals are propagated to the output of the ECL buffers 40 with substantially no skew.

Although it is not considered an essential part of the instant invention, it would be possible to apply the skew management methods described for clock circuit board 14 to any or all of the clock distribution circuitry contained on circuit boards 10a–10h. It is recognized, however, that the application of these methods to the extremities of the clock distribution system yields diminishing returns which may be warranted only in very high throughput digital systems.

This invention has been described herein in considerable detail in order to comply with the Patent statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. In a sequential digital logic system of the type including a plurality of logic circuit boards, each populated with clocked digital logic devices and interconnected with one another and to an edge connector by printed conductors, a centerplane having first and second major surfaces and a plurality of connector terminals on said first major surface for mating with said edge connectors on said logic circuit boards when said logic circuit boards are disposed in parallel, spaced relation to one another and project orthogonally from said first major surface of said centerplane, said centerplane including a pattern of printed wiring for interconnecting said plurality of connector terminals on said first major surface of said centerplane in a desired manner, the improvement comprising:
   (a) a clock distribution circuit board having clock pulse generator means mounted thereon, said clock pulse generator means producing regularly occurring clock pulse signals, clock driver circuit means coupled to said clock pulse generator means for simultaneously producing multiple copies of said clock pulse signals, an edge connector having a plurality of contacts, and a pattern of printed wiring for applying said multiple copies of said clock pulse signals to said plurality of contacts in exact time phase;
   (b) means for mounting said clock distribution circuit board to said second major surface of said centerplane orthogonal to both said centerplane and said plurality of logic circuit boards; and
   (c) connector means for coupling said plurality of contacts of said edge connector on said clock distribution board through said centerplane to said edge connectors of said logic circuit boards, whereby said clock pulse signals are introduced onto said logic circuit boards in exact time phase with respect to one another.

2. The sequential digital logic system as in claim 1 wherein said pattern of printed wiring for applying said multiple copies of said clock pulse signals to said plurality of contacts comprise a plurality of conductive foils of equal physical length.

3. The sequential digital logic system as in claim 1 wherein each of said logic circuit boards includes at least one buffer circuit means coupled to receive said clock pulse signals introduced onto said logic circuit boards for fanning-out said clock pulse signals to multiple ones of said clocked digital logic devices.

4. The sequential digital logic system as in claim 3 wherein each of said logic circuit boards further includes logic level converter means electrically disposed between said buffer circuit means and said clocked digital logic devices.

5. A system for distributing clock signals to a plurality of clocked digital logic devices located on a plurality of logic circuit boards, comprising:
   (a) a centerplane member having first and second major surfaces and a plurality of apertures through the thickness dimension thereof;
   (b) a plurality of logic circuit boards, each populated with said clocked digital logical devices interconnected with conductive foils, each of said logic circuit boards having one side edge disposed adjacent to said first major surface of said centerplane member and projecting outwardly therefrom in parallel, spaced relation with respect to adjacent ones of said logic circuit boards, said side edge including a multi-contact connector member;
   (c) a clock distribution board member having one side edge disposed adjacent to said second major surface of said centerplane member and oriented orthogonally to said centerplane member and to said plurality of logic circuit boards across said centerplane, said clock distribution board member having a multi-contact connector member mounted on said one side edge, said clock distribution board member including oscillator means for producing regularly occurring clock pulses, driver means coupled to said oscillator means for producing multiple copies of said clock pulses, and conductive foils for distributing said multiple copies to individual contacts of said multi-contact connector member in time coincidence; and
   (d) a plurality of shared, conductive, pin members extending through at least some of said apertures at the points where said side edges of said logic circuit boards and said clock distribution board member are juxtaposed, each said pin member including a first end for connecting to the edge connector of one of said plurality of logic circuit boards and a second end for connecting to said edge connector of said clock distribution board member wherein said multiple copies of said clock pulses are applied through said centerplane member to said plurality of logic circuit boards in time coincidence and without skew.

6. The system as in claim 5 wherein said conductive foils on said clock distribution board member are of equal physical length.

7. The system as in claim 5 wherein each of said logic circuit boards includes at least one buffer circuit means coupled to receive one of said multiple copies of said clock pulses applied through said centerplane member for fanning-out said clock pulse signals to multiple ones of said clocked digital logic devices.

8. The system as in claim 7 wherein each of said logic circuit boards further includes logic level converter means electrically disposed between said buffer circuit means and said clocked digital logic devices.

9. A method for distributing clock pulses to digital logic devices disposed on a plurality of separate logic boards having a side edge, said clock pulses being distributed without skew, comprising the steps of:
   (a) providing a centerplane member having first and second opposed major surfaces and a pattern of apertures extending through the thickness dimension thereof;
   (b) juxtaposing said side edge of each said logic boards adjacent to said first major surface of said centerplane member with said logic boards extending in parallel, spaced relation to one another and orthogonal to said centerplane;
   (c) providing a clock distribution board having a side edge and means for presenting multiple copies of clock pulses at multiple points along said side edge in exact time coincidence;
   (d) juxtaposing said side edge of said clock distribution board adjacent to said second major surface of said centerplane and orthogonal to said side edges of said logic boards, at least in portion of said side edge of said clock distribution board being in transverse alignment with said side edges of said logic boards across said centerplane;
   (e) inserting a plurality of shared pin members having first and second ends through said apertures; and
   (f) electrically connecting said logic boards to said clock distribution board via said shared pins.

10. The method as in claim 9 wherein said step of electrically connecting said logic boards to said clock distribution board comprises the steps of:
   (a) connecting said first end of said pin members to at least a portion of said side edges of said logic boards; and
   (b) connecting said second end of said pin member to at least a portion of said side edge of said clock distribution board.

11. The method as in claim 9 wherein the presenting of multiple copies of clock pulse signals at multiple points along said side edge includes the steps of:
   (a) providing a clock oscillator on said clock distribution board;
   (b) providing a fan-out driver having an input and plural outputs on said clock distribution board with said input connected to said clock oscillator and said plural outputs coupled by conductive foils of equal physical length to said multiple points.

* * * * *